(12) United States Patent
Park

(10) Patent No.: US 6,771,541 B1
(45) Date of Patent: Aug. 3, 2004

(54) METHOD AND APPARATUS FOR PROVIDING ROW REDUNDANCY IN NONVOLATILE SEMICONDUCTOR MEMORY

(75) Inventor: Eungjoon Park, Fremont, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 0 days.

(21) Appl. No.: 10/375,556

(22) Filed: Feb. 25, 2003

(51) Int. Cl.[7] .............................................. G11C 16/06
(52) U.S. Cl. ............................ 365/185.22; 365/185.18; 365/185.29
(58) Field of Search ....................... 365/185.22, 185.18, 365/185.29, 185.23

(56) References Cited

U.S. PATENT DOCUMENTS

| | | | |
|---|---|---|---|
| 5,233,559 A | 8/1993 | Brennan, Jr. | |
| 5,327,383 A | 7/1994 | Merchant et al. | |
| 5,347,489 A | 9/1994 | Merchant et al. | |
| 5,963,476 A | * 10/1999 | Hung et al. ............. | 365/185.18 |
| 6,301,152 B1 | 10/2001 | Campardo et al. | |
| 6,418,058 B1 | * 7/2002 | Sakui et al. ............ | 365/185.22 |

OTHER PUBLICATIONS

Brown, William D. and Brewer, Joe E., eds., Nonvolatile Semiconductor Memory Technology: A Comprehensive Guide to Understanding and Using NVSM Devices, IEEE Press, New York, 1998, pp. 69, 105, 107–108, 203, 213–217, 226–227, 235, 239–241, 244, 247, 279–281.

\* cited by examiner

*Primary Examiner*—Huan Hoang
(74) *Attorney, Agent, or Firm*—Altera Law Group, LLC

(57) ABSTRACT

In a NOR-type flash memory of either the ETOX or virtual ground type that is programmed using electron injection and erased using FN tunneling, and that has row redundancy, the typical sequence of operations used for an embedded sector erase, namely the Preprogram, Preprogram Verify, Erase, Erase Verify, Post-Program Verify, and Post-Program operations, need not be performed for the data cells on bad or shorted rows or in unused redundant rows. Instead, the bad or shorted rows or the unused redundant rows are suitably biased so that the threshold voltages of the data cells in these rows tend to converge to a threshold voltage near the UV erased threshold.

15 Claims, 7 Drawing Sheets

|  | PRE PGM | PRE PGM VERIFY | ERASE | ERASE VERIFY | POST PGM VERIFY | POST PGM |
|---|---|---|---|---|---|---|
| SELECTEC ROW | 10V | 6V | -10V | 4V | 2.5V | 5V |
| UNSELECTEC ROW | 0V | 0V | N/A | 0V | 0V | 0V |
| SELECTEC COLUMN | 5V | 1V | FLOAT | 1V | 1V | 3V |
| UNSELECTEC COLUMN | 0V | 0V | N/A | 0V | 0V | 0V |
| SOURCE | 0V | 0V | FLOAT | 0V | 0V | 0V |
| BULK | 0V | 0V | 6V | 0V | 0V | 0V |

FIG. 1 (PRIOR ART)

|  | P1<br>PRE PGM | V1<br>VERIFY | E<br>ERASE | V<br>VERIFY | V2<br>VERIFY | P2<br>POST PGM |
|---|---|---|---|---|---|---|
| SELECTED ROW | 10V | 6V | -10V | 4V | 2.5V | 5V |
| UNSELECTED ROW | 0V | 0V | N/A | 0V | 0V | 0V |
| ALL REDUNDANT ROWS | 0V | 0V | 0V | 0V | 0V | 0V |
| SELECTED COLUMN | 5V | 1V | FLOAT | 1V | 1V | 3V |
| UNSELECTED COLUMN | 0V | 0V | N/A | 0V | 0V | 0V |
| SOURCE | 0V | 0V | FLOAT | 0V | 0V | 0V |
| BULK | 0V | 0V | 6V | 0V | 0V | 0V |

| | P1<br>PRE<br>PGM | V1<br>VERIFY | E<br>ERASE | V<br>VERIFY | V2<br>VERIFY | P2<br>POST<br>PGM |
|---|---|---|---|---|---|---|
| SELECTED ROW | 10V | 6V | -10V | 4V | 2.5V | 5V |
| UNSELECTED ROW | 0V | 0V | N/A | 0V | 0V | 0V |
| BAD/UNUSED ROW | 0V | 0V | 0V | 0V | 0V | 0V |
| SELECTED COLUMN | 5V | 1V | FLOAT | 1V | 1V | 3V |
| UNSELECTED COLUMN | 0V | 0V | N/A | 0V | 0V | 0V |
| SOURCE | 0V | 0V | FLOAT | 0V | 0V | 0V |
| BULK | 0V | 0V | 6V | 0V | 0V | 0V |

|  | P1 PRE PGM | V1 VERIFY | E ERASE | V VERIFY | V2 VERIFY | P2 POST PGM |
|---|---|---|---|---|---|---|
| HTX<0:15> | 10V/0V | 6V/0V | 0V | 4V/0V | 2.5V/0V | 5V/0V |
| HTXB<0:15> | 0V/10V | 0V/6V | -10V | 0V/4V | 0V/2.5V | 0V/5V |
|  |  |  |  |  |  |  |
| XPU (I) | 10V/0V | 6V/0V | 0V/-10V | 4V/0V | 2.5V/0V | 5V/0V |
| XPM (J) | 10V/0V | 6V/0V | 0V/-10V | 4V/0V | 2.5V/0V | 5V/0V |
| XPD (K) | 10V/0V | 6V/0V | 0V | 4V/0V | 2.5V/0V | 5V/0V |
| XPR | 10V/0V | 6V/0V | -10V | 4V/0V | 2.5V/0V | 5V/0V |
|  |  |  |  |  |  |  |
| VPPX | 10V | 6V | 0V | 4V | 2.5V | 5V |
| VEEX | 0V | 0V | -10V | 0V | 0V | 0V |
|  |  |  |  |  |  |  |
| XHER | 0V | 0V | 0V | 0V | 0V | 0V |
| XHERB | 10V | 6V | -10V | 4V | 2.5V | 5V |

FIG. 9

|  | P1 PRE PGM | V1 VERIFY | E ERASE | V VERIFY | V2 VERIFY | P2 POST PGM |
|---|---|---|---|---|---|---|
| HTX<0:15> | 10V/0V | 6V/0V | 0V | 4V/0V | 2.5V/0V | 5V/0V |
| HTXB<0:15> | 0V/10V | 0V/6V | -10V | 0V/4V | 0V/2.5V | 0V/5V |
|  |  |  |  |  |  |  |
| XPU (I) | 10V/0V | 6V/0V | 0V/-10V | 4V/0V | 2.5V/0V | 5V/0V |
| XPM (J) | 10V/0V | 6V/0V | 0V/-10V | 4V/0V | 2.5V/0V | 5V/0V |
| XPD (K) | 10V/0V | 6V/0V | 0V/-10V | 4V/0V | 2.5V/0V | 5V/0V |
| XPR | 10V/0V | 6V/0V | 0V | 4V/0V | 2.5V/0V | 5V/0V |
|  |  |  |  |  |  |  |
| VPPX | 10V | 6V | 0V | 4V | 2.5V | 5V |
| VEEX | 0V | 0V | -10V | 0V | 0V | 0V |
|  |  |  |  |  |  |  |
| XHER | 0V | 0V | 0V | 0V | 0V | 0V |
| XHERB | 10V | 6V | -10V | 4V | 2.5V | 5V |

FIG. 10

METHOD AND APPARATUS FOR PROVIDING ROW REDUNDANCY IN NONVOLATILE SEMICONDUCTOR MEMORY

BACKGROUND OF THE INVENTION

1. Field of the Invention

The present invention relates to nonvolatile semiconductor memory, and more particularly to providing row redundancy in nonvolatile semiconductor memory.

2. Description of the Related Art

Nonvolatile semiconductor memory array retains stored data when power is removed. Many different types of nonvolatile data cells suitable for nonvolatile memory are known, including a class of single transistor devices that are based on the storage of charge in discrete trapping centers of a dielectric layer of the structure, and another class of devices that are based on the storage of charge on a conducting or semiconducting layer that is completely surrounded by a dielectric, typically an oxide. Techniques are also known for achieving multiple bit storage in a single transistor nonvolatile data cell by programming the multiple bits into a data cell as different voltage levels or in different parts of the cell. The trapped charge establishes the threshold voltage, or $V_T$, of the device, which is sensed when the memory is read to determine the data stored therein.

An illustrative well known type of compact floating gate data cell structure is the stacked gate structure. A floating gate, typically a doped polysilicon layer, is sandwiched between two insulator layers, typically oxide. The top layer of the stack is a control gate electrode, typically a doped polysilicon layer. In one type of floating gate transistor, the stacked gate structure overlies part of a heavily doped n+ source region and a heavily doped n+ drain region, as well as a channel region between the source region and the drain region. The channel region is part of a p-well, which also contains the source region, the drain region, and a heavily p+ doped contact region. The p-well typically is contained within an n-type substrate or within an n-well, which also contains a heavily n+ doped contact region. The n-well is in turn contained in the p-type substrate. Many variations in the floating gate data cell structure are known, and include asymmetrical stacked gate structures, split gate structures, and so forth. Moreover, although the structure described herein is an n-channel enhancement mode device, nonvolatile data cells may be fabricated as either n-channel or p-channel devices or as enhancement or depletion mode devices.

As is typical of nonvolatile data cells that are capable of being repeatedly programmed and erased, the various functions of the stacked gate data cell are controlled by applying various bias voltages. The voltage applied to the control gate is $V_G$, the voltage applied to the source is $V_S$, the voltage applied to the drain is $V_D$, the voltage applied to the p-well is $V_P$, the voltage applied to the n-well is $V_N$, and the voltage applied to the p-type substrate is $V_B$. Typically the substrate is grounded, i.e. $V_B=0V$. Typically writing or programming the data cell means adding negative charge to the floating gate while erasing the data cell means removing negative charge from the floating gate, but the charged state can be considered the erased state if desired. Other voltages are applied to read the charge state of the data cell by detecting the threshold voltage $V_T$ of the data cell, which ideally is done without disturbing the charge state.

Depending to some extent on device characteristics, stacked gate transistors may be programmed by moving electrons to the floating gate using Fowler-Nordheim ("FN") tunneling or electron injection. Electron injection typically is done using channel hot electron injection ("CHE") or channel-initiated secondary electron injection ("CISEI"). FN tunneling remains a popular choice in flash memory for erase operations.

A typical semiconductor memory contains millions of data cells. To avoid requiring that every one of the millions of data cells and associated connective structures in a non-volatile semiconductor memory device be error free and perfect, memory devices such as NOR-type flash memories often use redundant rows to repair bad rows. In one type of flash memory that supports sector erase, for example, a sector contains 512,000 bits of regular data cells (256 rows by 2K columns) and 32,000 bits of redundant cells (16 redundant rows by 2K columns.

During operation, conventional flash memories may be erased sector-by-sector using an embedded Sector Erase. However, if the data cells in the sector start out at different threshold voltages and only a sector erase operation is performed, some of the data cells may be erased near to or into depletion which will cause data errors in NOR-type flash memory products. To avoid this problem, a common practice for the embedded Sector Erase is to use a number of other operations in addition to the Sector Erase operation to prevent any of the data cells from being depleted.

The additional operations in common use for an embedded sector erase are Preprogram, Pre-Program Verify, Erase Verify (following the Erase operation), Post-Program Verify, and Post-Program. The first set of operations typically is a Pre-program followed by a Preprogram Verify. The objective of the Preprogram and Preprogram Verify operations is to program all of the cells in the selected sector, including the redundant cells, to a high $V_T$, illustratively $V_T=5$ volts, so that all of the cells can be erased from the same state. Both the Preprogram and Preprogram Verify operations are normally byte wide. The second set of operations typically is Erase followed by Erase Verify. All of the data cells including the redundant data cells in the selected sector are erased to a low $V_T$, illustratively $V_T<3$ volts. Erase is normally a bulk operation, and Erase Verify is normally a byte wide operation. The third set of operations typically is a Post-Program Verify followed by a Post-Program. All the cells including the redundant cells in the selected sector that fail Post-Program Verify, which occurs when they are erased too much (illustratively $V_T<0.5$ volts), are Post-Programed and Post-Program Verified again so that all of the data cells in the selected sector have their threshold voltage $V_T$ in a range of from 0.5 volts to 3 volts, for example. The Post-Program Verify and Post-Program operations are normally byte wide operations. The Table of FIG. 1 shows illustrative bias conditions for a selected sector of a flash memory array that uses CHE for programming and FN for erase, during each of the operations in an embedded sector erase. In unselected sectors, all of the row lines, columns, sources and the bulk remain grounded during all operations.

First, for the Preprogram operation, the source and bulk, used in this embodiment to refer to the p-well in which the data cell is fabricated (typically contained within a higher biased n-well, which in turn is in a grounded substrate), are biased at 0 volts for all cells in the selected sector, the selected row is biased at 10 volts, and the selected columns (typically one byte) is biased at 5 volts. Hot electrons are injected into the floating gate of the floating gate transistors in the selected data cells, which raises their threshold voltage $V_T$. A suitably high $V_T$ value is $V_T=5$ volts.

Next, for the Preprogram Verify operation, the source and bulk are biased at 0 volts for all cells in the selected sector, the selected row is biased at 6 volts, and the selected column is biased at 1 volt to sense the threshold voltage. If the threshold voltage is correct, no further programming of the particular data cell is performed. However, if the threshold voltage is not correct, the particular data cell is again Preprogrammed and Preprogram Verified until an acceptable threshold voltage is achieved.

Next, for the Erase operation, the source is floated, the bulk is biased at 6 volts for the selected sector, the rows of the selected sector are biased at minus 10 volts, and the columns of the selected sectors are floated. Electrons tunnel from the floating gates of the floating gate transistors in the selected data cells to the bulk, which lowers their threshold voltage $V_T$. A suitably low $V_T$ value is $V_T<3$ volts.

Next, for the Erase Verify operation, the source and bulk are biased at 0 volts for all cells in the selected sector, the selected row is biased at 4 volts, and the selected column is biased at 1 volt to sense the threshold voltage. If the threshold voltages of each of the cells is less than the highest allowable low $V_T$ value, no further erase is performed. Otherwise, the erase and erase verify operations are repeated until the threshold voltages of all cells are achieved or an error condition is reported.

Next, for the Post-Program Verify operation, the source and bulk are biased at 0 volts for all cells in the selected sector, the selected row is biased at 2.5 volts, and the selected column is biased at 1 volt to sense the threshold voltage. If the threshold voltage is greater than or equal to the lowest allowable low $V_T$ value, say a $V_T$ of 0.5 volts, no Post-Programming of the particular data cell is performed. However, if the threshold voltage is too low, the particular data cell is Post-Programmed.

Next, for the Post-Program operation, the source and bulk are biased at 0 volts for all cells in the selected sector, the selected row is biased at 5 volts, and the selected column is biased at 3 volts. Weak hot electron injection occurs into the floating gate of the floating gate transistors in the selected data cells, which minutely raises their threshold voltage $V_T$. Post-Program and Post-Program Verify are repeated until an acceptable threshold voltage is achieved.

The foregoing technique for embedded sector erase is effective when redundant rows are used to replace a word line group having an individually defective row. However, the technique can be ineffective when two regular rows are shorted together. The problem arises when cells are being programmed in only one of two shorted rows. In this event, the selected row is biased at 10V and the unselected row is biased to 0V, but since the rows are physically shorted, a functional failure results.

Some of the various techniques for implementing row redundancy in nonvolatile memory, including techniques for handling shorted rows, are disclosed in U.S. Pat. No. 5,233,559, issued Aug. 3, 1993 to Brennan, Jr. and entitled "Row Redundancy for Flash Memories," U.S. Pat. No. 5,347,489 issued Sep. 13, 1994 to Merchant et al. and entitled "Method and Circuitry for Preconditioning Shorted Rows in a Non Volatile Semiconductor Memory Incorporating Row Redundancy," U.S. Pat. No. 5,327,383 issued Jul. 5, 1994 to Merchant et al. and entitled "Method and Circuitry for Erasing a Nonvolatile Semiconductor Memory Incorporating Row Redundancy," and U.S. Pat. No. 6,301,152 issued Oct. 9, 2001 to Campardo et al. and entitled "Non Volatile Memory Device With Row Redundancy." Despite these and other various techniques, a need remains for a row redundancy technique for flash memories that has low decoder and controller overhead and is nonetheless able to replace even two shorted rows.

BRIEF SUMMARY OF THE INVENTION

One embodiment of the present invention is a method of operating a nonvolatile semiconductor memory in preparation for programming one or more data cells therein. The method comprises identifying a plurality of used rows and a plurality of unused rows of nonvolatile data cells within a common bulk region of the memory, at least some of the unused rows being either bad rows or redundant rows; preprogramming the data cells of the used rows; during the preprogramming step, establishing on the data cells of the unused rows a bias condition that tends to converge the data cells of the unused rows to a threshold voltage near a UV erased threshold; and erasing the data cells of the used rows.

Another embodiment of the present invention is a method of performing an embedded erase of nonvolatile semiconductor memory having a plurality of rows of data cells arranged in a plurality of sectors, wherein some of the rows of data cells within each sector are regular rows of data cells and some of the rows of data cells within each sector are redundant rows of data cells. The method comprises identifying a plurality of word line groups for use, within each of the sectors; identifying at least one word line group within each of the sectors for nonuse; selecting a sector; programming the data cells in the word line groups identified for use in the selected sector; biasing the rows of the word line group or groups identified for nonuse during the programming step so that the data cells thereof tend to converge to a threshold voltage near a UV erased threshold; erasing the data cells in the word line groups identified for use in the selected sector; and biasing the rows of the word line group or groups identified for nonuse during the erasing step so that the data cells thereof are not erased.

Another embodiment of the present invention is a nonvolatile semiconductor memory comprising a memory array having a plurality of rows of nonvolatile data cells arranged in a plurality of sectors, the rows of data cells having respective word lines; a plurality of word line drivers coupled to the word lines; a plurality of word line pre-drivers coupled to respective groups of the word line drivers; a sector pre-decoder coupled to the word line pre-drivers; a regular word line group pre-decoder coupled to the word line pre-drivers; a redundant word line group pre-decoder coupled to the word line drivers; a word line pre-decoder coupled to the word line pre-drivers; a redundant word line group selector coupled to the redundant word line group pre-decoder; and an X address line coupled to the sector pre-decoder, the regular word line group pre-decoder, the redundant word line group pre-decoder, the word line pre-decoder, and the redundant word line group selector.

Another embodiment of the present invention is a nonvolatile semiconductor memory comprising means for identifying a plurality of used rows and a plurality of unused rows of nonvolatile data cells within a common bulk region of the memory, at least some of the unused rows being either bad rows or redundant rows; means for preprogramming the data cells of the used rows; means for establishing on the data cells of the unused rows, in coordination with the preprogramming means, a bias condition that tends to converge the data cells of the unused rows to a threshold voltage near a UV erased threshold; and means for erasing the data cells of the used rows.

BRIEF DESCRIPTION OF THE SEVERAL VIEWS OF THE DRAWINGS

FIG. 1 is a table useful for describing bias voltages of various nodes in a selected sector for various operations commonly used in the prior art.

FIG. 9 is a table useful for describing the bias conditions of the signals shown in the pre-decoder of FIG. 8, for an embedded sector erase of a memory that has no repaired rows.

FIG. 10 is a table useful for describing the bias conditions of the signals shown in the pre-decoder of FIG. 8, for an embedded sector erase of a memory that has repaired rows.

DETAILED DESCRIPTION OF THE INVENTION, INCLUDING THE BEST MODE

In a single transistor NOR-type flash memory of either the ETOX or virtual ground type that uses row redundancy, and illustratively wherein the erased cell threshold voltage is lower than the programmed cell threshold voltage, we have found that the typical sequence of operations used for an embedded sector erase of a selected sector, namely the Preprogram, Preprogram Verify, Erase, Erase Verify, Post-Program Verify, and Post-Program operations, need not and should not be performed for the data cells on bad or shorted rows or in unused redundant rows. Instead, the bad or shorted rows or the unused redundant rows are suitably biased so that the threshold voltages of the data cells in these rows tend to converge to a threshold voltage near the UV erased threshold. For the unselected sectors, the sector select transistors are off so as to eliminate bit line disturb, and since each of the sectors resides in an isolated p-well, the unselected sectors do not experience bulk disturb.

Figure 2:
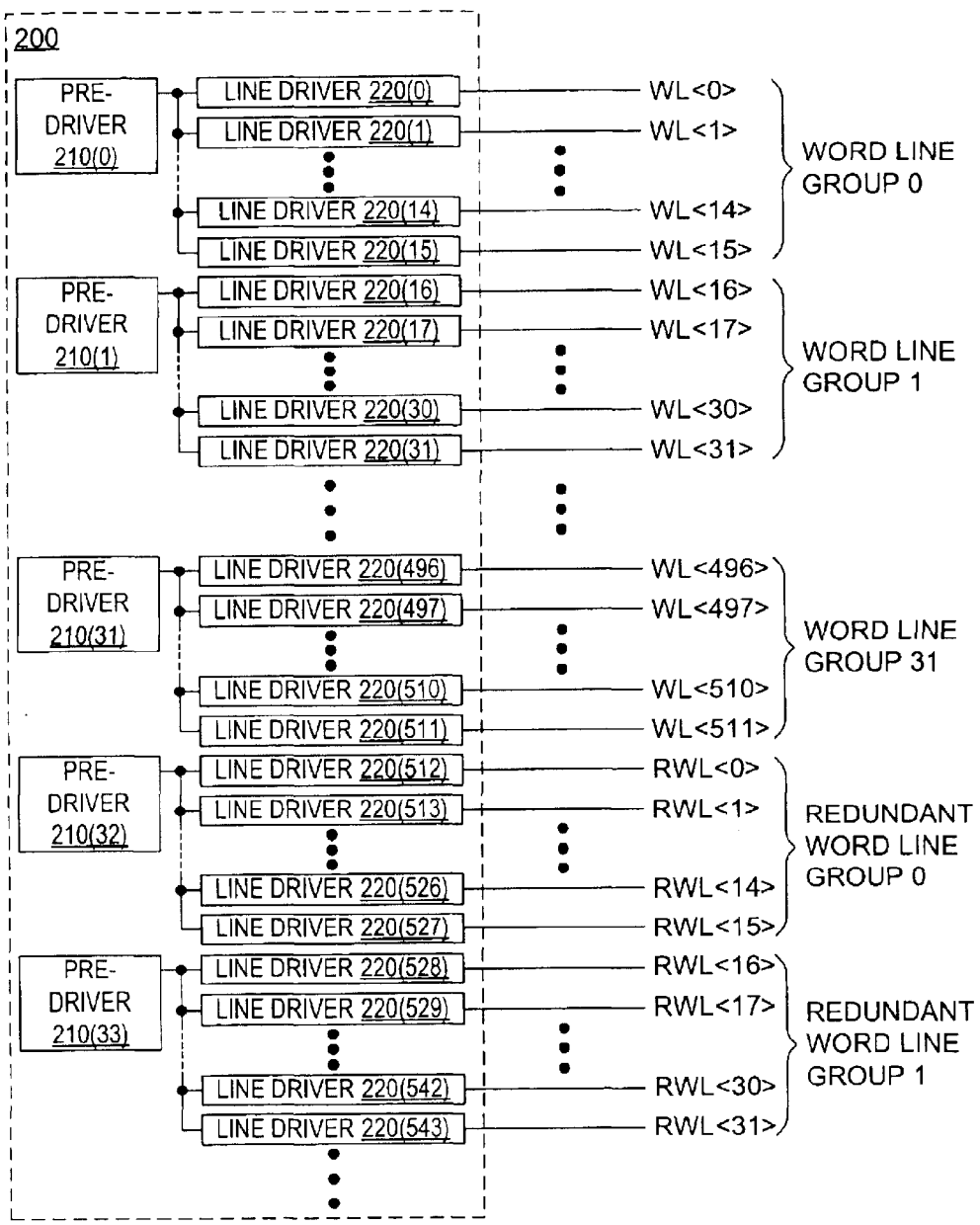
FIG. 2 is a schematic diagram showing a grouping of word lines into regular word line groups and redundant word line groups.

An illustrative word line structure for a sector of a NOR-type flash memory is shown in FIG. 2. Illustratively, the sector has 512 word lines for regular cells. The word lines are grouped into 32 word line groups, each having sixteen word lines. Thirty-two redundant word lines are included in the sector as two redundant word line groups, each also having sixteen word lines. Illustratively, the word lines of each word line group, regular or redundant, are driven by respective word line drivers and a predriver. The word lines of the flash memory are driven by an X-decoder 200, which illustratively has a pre-driver 210(0) and sixteen word line drivers 220(0) through 220(15) for the group 0, a pre-driver 210(1) and sixteen word line drivers 220(16) through 220(31) for the group 1, and so forth. Illustrative pre-driver and line driver circuits are shown in detail in FIG. 8.

Figures 5, 6:
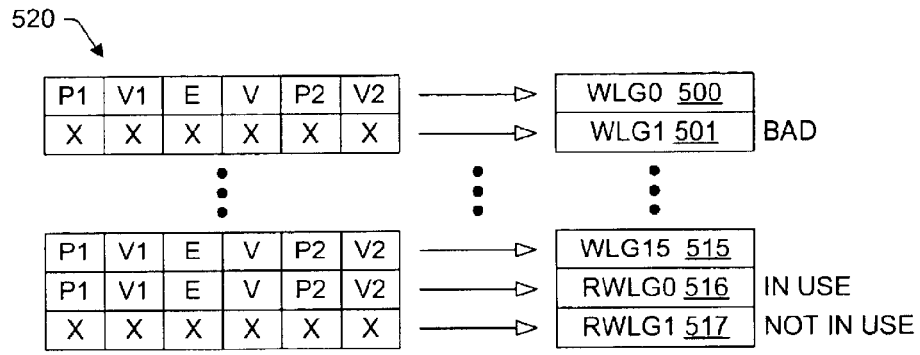
FIG. 5 is a schematic diagram showing the biasing operations that are performed on the regular word line groups and a redundant word line group in a selected sector during an embedded sector erase of a memory that has repaired rows.
FIG. 6 is a table useful for describing the bias voltages used in the biasing operations shown in FIG. 5.

The operations performed on the data cells in the sector depend on whether the redundant rows are used to repair any regular rows. The operations performed when none of the regular rows are bad are summarized in FIG. 3, and the operations performed when the redundant rows are used to repair some bad regular rows are shown in FIG. 5. The replaced word line group is considered to be a bad word line group, and the other regular word line groups are considered to be good word line groups. Illustratively, the data cells in the various word line groups are programmed using electron injection and erased using FN tunneling.

Figures 3, 4:
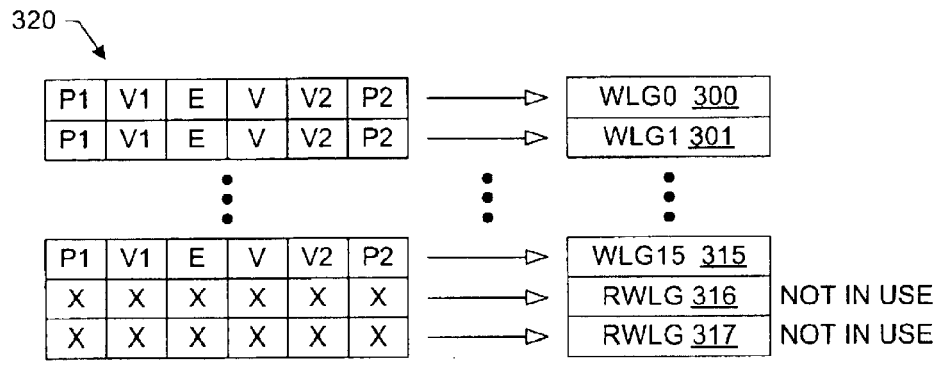
FIG. 3 is a schematic diagram showing the biasing operations that are performed on the regular word line groups and a redundant word line group in a selected sector during an embedded sector erase of a memory that has no repaired rows.
FIG. 4 is a table useful for describing the bias voltages used in the biasing operations shown in FIG. 3.

FIG. 3 illustratively shows sixteen word line groups 300 (WLG0) through 315 (WLG15) and two word line groups 316 and 317 (RWLG0 and RWLG1) of redundant rows. Illustrative bias voltages for the Preprogram operation $P_1$, the Preprogram Verify operation $V_1$, the Erase operation E, the Erase Verify operation V, the Post-Program Verify operation $V_2$, and the Post-Program operation $P_2$ are shown in FIG. 4. If it is determined at the time of manufacture that none of the regular rows are bad, then the biasing sequence for performing an embedded sector erase shown in table 320 are performed on the data cells in the word lines of the various word line groups. Specifically, the byte-wise Preprogram operation $P_1$, the byte-wise Preprogram Verify operation $V_1$, the sector wide Erase operation E, the byte-wise Erase Verify operation V, the byte-wise Post-Program Verify operation $V_2$, and the byte-wise Post-Program operation $P_2$ are performed on the data cells in the regular word line groups 300–315 of the selected sector. These operations are not performed on the data cells in the unused redundant word line groups 316 and 317. Instead, all the redundant rows are all grounded during all of the embedded sector erase operations, so that the threshold voltage of the data cells in the redundant word line group does not significantly deviate from the UV Erased threshold voltage during the cycle lifetime of the memory, typically 100,000 program and erase cycles.

In the Preprogram and the Preprogram Verify operations the regular data cells of the selected sector are programmed to a high $V_T$ such as, for example, $V_T$=5 volts, so that they can be erased from the same charge level. The Preprogram and the Preprogram Verify operations are not performed on the data cells in the redundant word line groups 316 and 317, the threshold voltage of which is near the UV erased level, typically $V_T$=2 volts, prior to sector preprogramming, and remains so even while the data cells in the regular rows are being programmed. This is because the cells in the redundant rows are in a bit line convergence condition, since they are biased at $V_D$=5 volts and $V_G$=$V_S$=$V_B$=0 and this bias condition normally causes low or high threshold voltage to converge to a threshold voltage near the UV Erased threshold voltage. As a result, the data cells in the redundant rows are prevented from having an excessively low threshold voltage.

For the Preprogram operation, the source and bulk are biased at 0 volts for all cells in the selected sector, the selected row is biased at 10 volts, and the selected columns (typically one byte at a time, but could be a fewer or greater number of bits at a time) are biased at 5 volts. Hot electrons are injected into the floating gate of the floating gate transistors in the selected data cells, which raises their threshold voltage $V_T$. For the Preprogram Verify operation, the source and bulk are biased at 0 volts for all cells in the selected sector, the selected row is biased at 6 volts, and the selected column is biased at 1 volt to sense the threshold voltage. If the threshold voltage is correct, no further programming of the particular data cell is performed. However, if the threshold voltage is not correct, the particular data cell is again Preprogrammed and Preprogram Verified until an acceptable threshold voltage is achieved. The Preprogramming and preprogram verification proceed throughout the sector on a byte-by-byte basis, except that the redundant rows are neither preprogrammed nor preprogram verified, and remain biased at 0 volts through the various Preprogram operations and Preprogram Verify operations.

In the Erase and Erase Verify operations, the data cells in the regular rows of the selected sector are erased to a low threshold voltage, illustratively $V_T<3$ volts. During bulk erase the data cells in the redundant rows are not erased, but are nonetheless exposed to erase disturb from the bulk so that their threshold voltage tends to lower slightly, about 0.2 volts for 100,000 sector erases of about 1 second each. However, any lowering of the threshold voltage due to bulk disturb is cancelled out by the bit line convergence during the Preprogram operations, which causes both high and low threshold voltages to converge to a threshold voltage near the UV Erased threshold voltage.

For the Erase operation, the source is floated, the bulk is biased at 6 volts for the selected sector, the regular rows of the selected sector are biased at minus 10 volts, and the columns of the selected sectors are floated. Electrons tunnel from the floating gates of the floating gate transistors in the selected data cells to the bulk, which lowers their threshold voltage $V_T$. The redundant rows of the selected sector are biased at 0 volts so that they are not erased, but they do experience a little erase disturb from the bulk. For the Erase Verify operation, the source and bulk are biased at 0 volts for all cells in the selected sector, the selected row is biased at 4 volts, and the selected column is biased at 1 volt to sense the threshold voltage. If the threshold voltage is correct, no further threshold voltage adjustment of the particular data cell is performed. However, if the threshold voltage is too low, the particular data cell is subject to a Post-program and Post-Program Verified operations until an acceptable threshold voltage is achieved. The redundant rows are not erase-verified, and are biased at 0 volts throughout the erase verify operations for the sector.

The Post-Program Verify and Post-Program operations are not performed on any of the redundant data cells, but are performed on the regular data cells in the selected sector, which could have been over-erased such that their threshold voltage is too low, illustratively $V_T<0.5$ volts. The Post-Program Verify and Post-Program operations bring the threshold voltages of these over-erased data cells into an illustrative range of 0.5 volts to 3 volts.

For the Post-Program Verify operation, the source and bulk are biased at 0 volts for all of the data cells in the selected sector, the selected row is biased at 2.5 volts, and the selected column is biased at 1 volt to sense the threshold voltage. If the threshold voltage is correct, no Post-Programming of the particular data cell is performed. However, if the threshold voltage is not correct, the particular data cell is Post-Programmed and Post-Program Verified until an acceptable threshold voltage is achieved. The redundant rows are not post-program verified, and are biased at 0 volts throughout the post program verify operations for the sector. For the Post-Program operation, the source and bulk are biased at 0 volts for all data cells in the selected sector, the selected row is biased at 5 volts, and the selected column is biased at 3 volts. Weak hot electron injection occurs into the floating gate of the floating gate transistors in the selected data cells, which slightly raises their threshold voltage $V_T$. The redundant rows are not post-programmed, and are biased at 0 volts throughout the post programming operations for the sector.

FIG. 5 illustratively shows sixteen word line groups 500 (WLG0) through 515 (WLG15) and two word line groups 516 and 517 (RWLG0 and RWLG1) of redundant rows. Illustrative bias voltages for the Preprogram operation $P_1$, the Preprogram Verify operation $V_1$, the Erase operation E, the Erase Verify operation V, the Post-Program Verify operation $V_2$, and the Post-Program operation $P_2$ are shown in FIG. 6. If it is determined at the time of manufacture that one of the regular rows is bad, then the word line group containing the bad row or rows, illustratively word line group 501, is replaced by one of the redundant word line groups, illustratively redundant word line group 516. The biasing sequence for performing an embedded sector erase shown in table 520 are performed on the data cells in the word lines of the various word line groups. Specifically, the byte-wise Preprogram operation $P_1$, the byte-wise Preprogram Verify operation $V_1$, the sector-wise Erase operation E, the byte-wise Erase Verify operation V, the byte-wise Post-Program Verify operation $V_2$, and the byte-wise Post-Program operation $P_2$ are performed on the data cells in the good word line groups and in the used redundant word line group 516. These operations are not performed on the data cells in the bad word line group 501 or on the unused redundant word line group 517. Instead, all of the rows in the bad word line group 501 and in the redundant word line group 517 are grounded during all of the embedded sector erase operations, so that the threshold voltage of the data cells in these word line groups does not significantly deviate from the UV Erased threshold voltage over the cycle lifetime of the memory.

In the Preprogram and the Preprogram Verify operations, the data cells in the good word line groups and in the redundant word line group 516 are programmed to a high $V_T$ such as, for example, $V_T=5$ volts, so that they can be erased from the same charge level. The Preprogram and the Preprogram Verify operations are not performed on the data cells in the bad regular word line group 501 or the redundant word line group 517, the threshold voltage of which is near the UV erased level, typically $V_T=5$ volts, prior to sector preprogramming, and remains so even while the other data cells of the good word line groups and the redundant word line group are being programmed. This is because the data cells in the bad word line group 501 and in the unused redundant word line group 517 are in a bit line convergence condition, since they are biased at $V_D=5$ volts and $V_G=V_S=V_B=0$ and this bias condition normally causes low or high threshold voltage to converge to a threshold voltage near the UV Erased threshold voltage. As a result, the data cells in the bad word line group 501 and the redundant word line group 517 are prevented from having an excessively low threshold voltage.

For the Preprogram operation, the source and bulk are biased at 0 volts for all data cells in the selected sector, the selected row is biased at 10 volts, and the selected columns (typically one byte) is biased at 5 volts. Hot electrons are injected into the floating gate of the floating gate transistors in the selected data cells, which raises their threshold voltage $V_T$. For the Preprogramm Verify operation, the source and bulk are biased at 0 volts for all cells in the selected sector, the selected row is biased at 6 volts, and the selected column is biased at 1 volt to sense the threshold voltage. If the threshold voltage is correct, no further programming of the particular data cell is performed. However, if the threshold voltage is not correct, the particular data cell is again Preprogrammed and Preprogram Verified until an acceptable threshold voltage is achieved. The Preprogramming and preprogram verification proceed throughout the sector on a byte-by-byte basis, except that the data cells in the bad word line group 501 and the redundant word line group 517 are neither preprogrammed nor preprogram verified, and remain biased at 0 volts through the various Preprogram operations and Preprogram Verify operations.

In the Erase and Erase Verify operations, the data cells in the good rows and the selected redundant rows of the selected sector are erased to a low threshold voltage, illustratively $V_T<3$ volts. During bulk erase the data cells in the bad word line group 501 and the redundant word line group 517 are not erased, but are nonetheless exposed to erase disturb from the bulk so that their threshold voltage tends to lower slightly. However, any lowering of the threshold voltage due to bulk disturb is cancelled out by the bit line convergence during the Preprogram operations, which causes both high and low threshold voltages to converge to a threshold voltage near the UV Erased threshold voltage.

For the Erase operation, the source is floated, the bulk is biased at 6 volts for the selected sector, the rows in the good word line groups and in the used redundant word line group 516 of the selected sector are biased at minus 10 volts, and the columns of the selected sectors are floated. Electrons tunnel from the floating gates of the floating gate transistors in the selected data cells to the bulk, which lowers their threshold voltage $V_T$. The rows in the bad word line group 501 and in the unused redundant word line group 517 are biased at 0 volts so that they are not erased, but they do experience a little erase disturb from the bulk. For the Erase Verify operation, the source and bulk are biased at 0 volts for all cells in the selected sector, the selected row is biased at 4 volts, and the selected column is biased at 1 volt to sense the threshold voltage. If the threshold voltage is correct, no further threshold voltage adjustment of the particular data cell is performed. However, if the threshold voltage is too low, the particular data cell is subject to Post-Program Verify and Post-Program operations until an acceptable threshold voltage is achieved. The rows in the bad word line group 501 and the unselected redundant word line group 517 are not erase-verified, and are biased at 0 volts throughout the erase verify operations for the sector.

The Post-Program Verify and Post-Program operations are not performed on any of the data cells in the bad word line group 501 and the unselected redundant word line group 517, but are performed on the data cells in the good word line groups and in the redundant word line group 516 that have been over-erased such that their threshold voltage is too low, illustratively $V_T<0.5$ volts. The Post-Program Verify and Post-Program operations bring the threshold voltages of these over-erased data cells into an illustrative range of 0.5 volts to 3 volts.

For the Post-Program Verify operation, the source and bulk are biased at 0 volts for all cells in the selected sector, the selected row is biased at 2.5 volts, and the selected column is biased at 1 volt to sense the threshold voltage. If the threshold voltage is correct, no Post-Programming of the particular data cell is performed. However, if the threshold voltage is not correct, the particular data cell is Post-Programmed and Post-Program Verified until an acceptable threshold voltage is achieved. The data cells in the bad word line group 501 and in the unselected redundant word line group 517 are not post-program verified, and their word lines are biased at 0 volts throughout the post program verify operations for the sector. For the Post-Program operation, the source and bulk are biased at 0 volts for all data cells in the selected sector, the selected row is biased at 5 volts, and the selected column is biased at 3 volts. Weak hot electron injection occurs into the floating gate of the floating gate transistors in the selected data cells, which slightly raises their threshold voltage $V_T$. The data cells in the bad word line group 501 and in the unselected redundant word line group 517 are not post-programmed, and their word lines are biased at 0 volts throughout the post programming operations for the sector.

FIG. 5 shows two redundant word line groups 516 and 517, which allows two bad pages in a word line group or even a short between two word lines in the same or different word line group to be repaired. However, if desired only a single redundant word line group may be used, or more than two redundant word line groups may be used.

Figure 7:
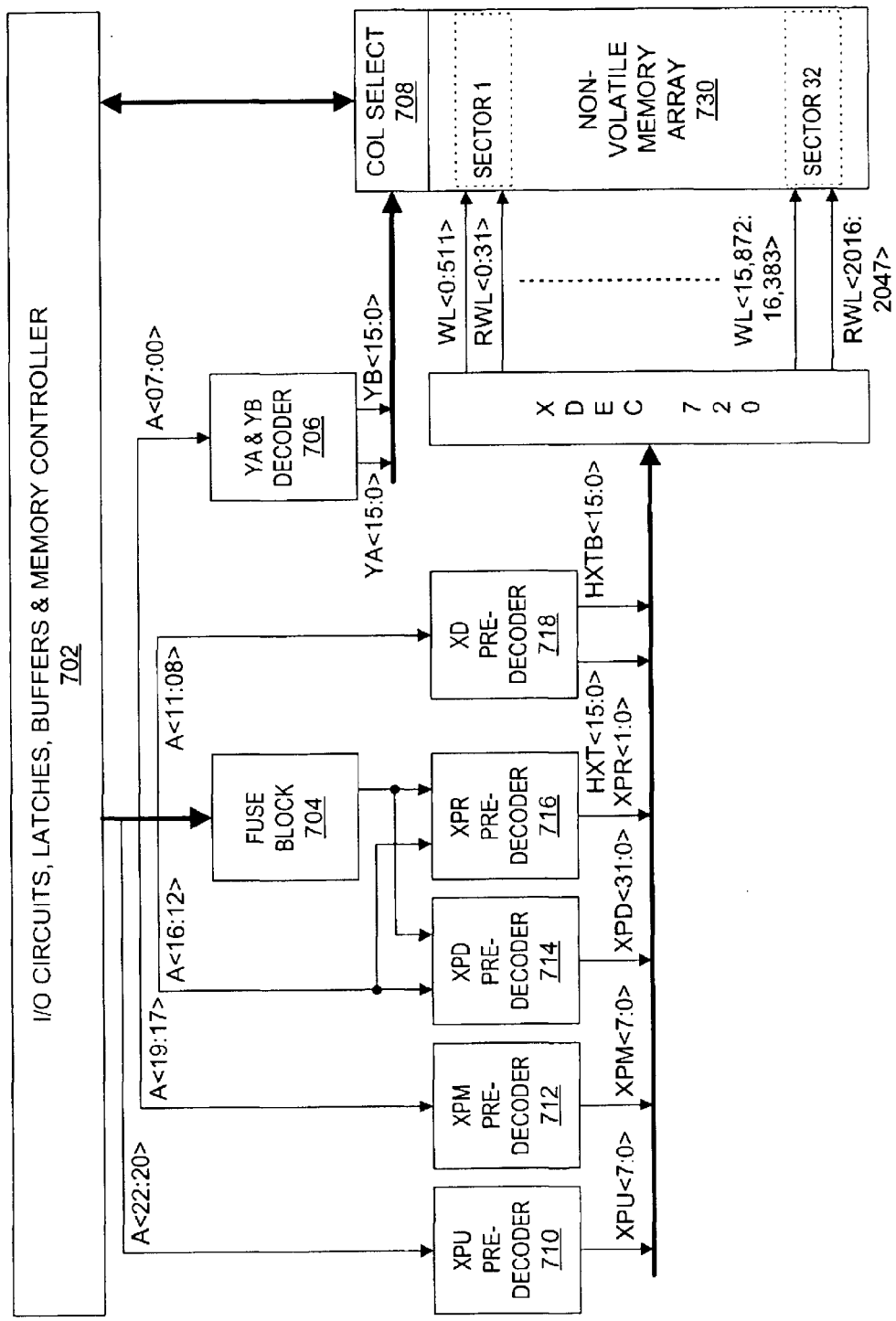
FIG. 7 is a block schematic diagram of various pre-decode circuits and an X-decoder circuit for a flash memory.

FIG. 7 is a block schematic diagram showing a decoding circuit for a nonvolatile memory array 730. A fuse block 704 implements repair of bad rows. Various pre-decode circuits including an XPU pre-decoder 710, an XPM pre-decoder 712, an XPD pre-decoder 714, an XPR pre-decoder 716, and an XD pre-decoder 718 pre-decode respective address segments A<22:20>, A<19:17>, A<16:12> and A<11:08>, and supply respective pre-decode signals XPU<7:0>, XPM<7:0>, XPD<31:0>, XPR<1:0>, HXT<15:0> and HXTB<15:0> to an X decoder 720. The X decoder 720 suitably biases the word lines WL<0:16383> and the redundant word lines RWL<0:2047>, which are suitably grouped into sectors such as sector 1, which is served by WL<0:511> and RWL<0:31>, and sector 63, which is served by WL<15872:16383> and RWL<2016:2047>. In addition, a YA and YB decoder 706 supplies signals YA<15:0> and YB<15:0> to a column select circuit 708. A variety of circuits that are not germane to the decoding technique, such as input/output circuits, latches, buffers, and a memory controller are represented by block 702. Suitable circuits of these types are well known in the art.

The fuse block 704, the XPU pre-decoder, the XPM pre-decoder, the YA & YB decoder 706, and the Y column select 708 operate in a manner that is well known in the art. The operations of the XPD pre-decoder 714, which selects regular word line groups, the XPR pre-decoder 716, which selects the redundant word line groups and allows the repair of shorted word lines from different word line groups, the XD pre-decoder, which selects individual word lines for certain programming and verify operations, and the X-decoder 720, which is responsive to the various pre-decoders for driving individual word lines or individual word line groups as appropriate, are as follows.

All operations of the embedded sector erase except for the Erase operation are performed on a subset of the cells on a word line, preferably one or two bytes. In these operations, XPD<31:0> are decoded from the address A<16:12> if the address does not match with any of the defect addresses which are repaired. However, if the address A<16:12> matches with a defect address which had been repaired, the XPD<31:0> outputs are disabled and the appropriate XPR<1:0> signal for the redundant word line group that includes the addressed defect row is enabled.

During an Erase operation of a sector that does not have any defective rows, all XPDs are enabled and all XPRs are disabled. During an Erase operation of a sector that has one or more defective rows, all XPDs corresponding to the word line group or groups that include the defective rows are disabled while the other XPDs are enabled. XPRs corresponding to the redundant word line group or groups that repair the word line groups having defective rows are enabled, while XPRs corresponding to the redundant word lines group or groups not used for repair are disabled.

Figure 8:
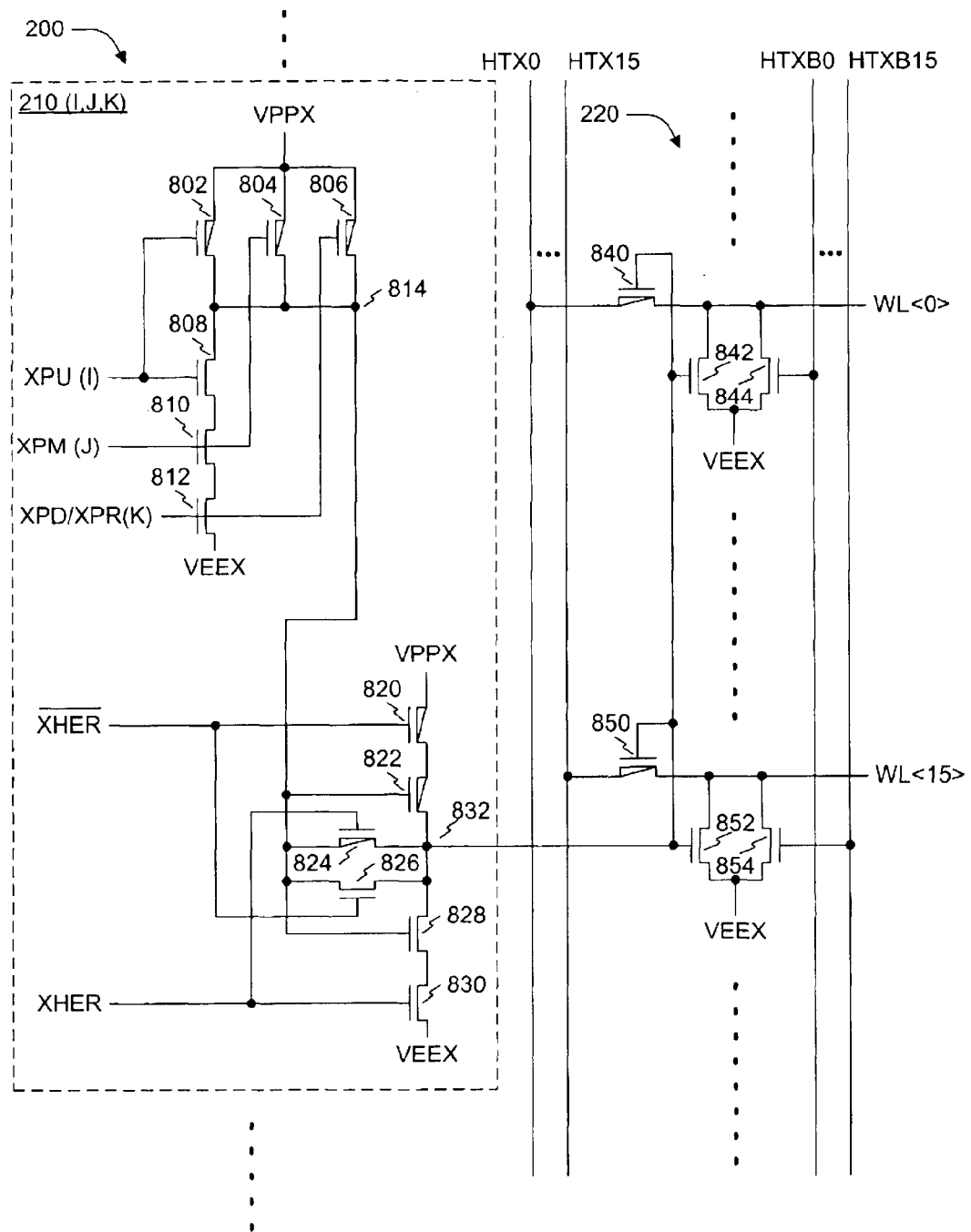
FIG. 8 is a component level schematic diagram of the X-decoder circuit of FIG. 7, including 16 word line drivers for a word line group.

FIG. 8 shows an illustrative embodiment of a pre-driver 210(I,J,K) and sixteen line drivers in the line drivers 220.

The illustrative word line group has sixteen word lines WL<0:15>. The signals XPU and XPM, which are predecoded from A<22:20> and A<19:17>, select a particular sector. The signal XPD, which is pre-decoded from A<16:12>, selects a particular word line group. The signal XPR is a predecoded output from the redundant row fuse block 704 (FIG. 7), and selects a particular redundant word line group that repairs a regular word line group containing one or more bad word lines. The signals XPU(I), XPM(J), and XPD/XPR(K) are applied respectively to transistors 802 and 808, 804 and 810, and 806 and 812. When these signals are all high to indicate a selected word line group within a selected sector, the voltage VEEX is applied to node 814. When any one or more of these signals is low, which indicates an unselected word line group, the voltage VPPX is applied to node 814.

Signals XHER and XHERB are erase control signals. Signal XHERB is applied to the gate of p-channel transistor 820, while the signal XHER is applied to the gate of n-channel transistor 830. A p-channel transistor 822 and n-channel transistor 828 are connected in series with the transistors 820 and 830, with node 832 being between the transistor 822 and the transistor 828. The transistors 822 and 828 have their gates connected to node 814. A p-channel transistor 824 and an n-channel transistor 826 are connected between node 814 and node 832.

A word line driver for the word line WL<0> has n-channel transistors 842 and 844 connected between WL<0> and VEEX. The control gate of transistor 844 is connected to HTXB0, and the control gate of transistor 842 is connected to node 832. A p-channel transistor 840 is connected between HTX0 and WL<0>, and has its gate connected to node 832. The other fifteen word lines of the word line group are connected between successive lines HTX# and HTXB#, but are otherwise identical.

During the erase operation of an embedded erase, XHER and XHERB are 0 volts and minus 10 volts respectively so that the transistors 820 and 830 are on, the transistors 824 and 826 are off, and HTX# and HTXB# are at 0 volts and minus 10 volts respectively. If the word line group is selected, the node 814 is at VEEX and node 832 is at VPPX. As a result, transistor 842 is on and WL<0> is brought to VEEX, or minus 10 volts. The corresponding transistors of the other word line drivers (such as transistor 852) are also on, and the corresponding word lines (such as WL<5>) are also brought to VEEX. Accordingly the cells of the entire word line group are erased. If the word line group is not selected, the node 814 is at VPPX and node 832 is at VEEX. As a result, transistor 840 is on and word line WL<0> is brought to 0 volts.

During the other operations of an embedded erase, XHER and XHERB are 10 volts and zero volts respectively so that the transistors 820 and 830 are off and the transistors 824 and 826 are on. If the word line group is selected, the node 814 is at VEEX and node 832 is at VEEX. As a result, transistor 840 is on and transistor 842 is off and the value of WL<0> is dependent on HTX0 and HTXB; specifically, WL<0> is brought high if HTX0 is high, and is brought low if HTX0 is low. If the word line group is unselected, the node 814 is at VPPX and node 832 is at VPPX. As a result, transistor 840 is off and transistor 842 is on, so that the value of WL<0> is VEEX.

The tables of FIG. 9 and FIG. 10 show illustrative bias conditions for the signals in FIG. 8. The FIG. 9 bias conditions apply when no repair is done, while the FIG. 10 bias conditions apply when repair is done. The convention for XPU(I), XPM(J), XPD(K) and XPR is "data for selected input/data for unselected input."

The description of the invention and its applications as set forth herein is illustrative and is not intended to limit the scope of the invention. Variations and modifications of the embodiments disclosed herein are possible, and practical alternatives to and equivalents of the various elements of the embodiments will be apparent to those of ordinary skill in the art from a reading of this detailed description. For example, while various operations are described as being performed on a byte-wise basis, the use of byte-wide operations is illustrative, and the operations may be performed on groupings of bits that are less than a byte (2 or 4 bits at a time, for example) or more than a byte, and even multiple bytes (16 bits at a time, for example), if so desired. These and other variations and modifications of the embodiments disclosed herein may be made without departing from the scope and spirit of the invention.

What is claimed is:

1. A method of operating a nonvolatile semiconductor memory in preparation for programming one or more data cells therein, comprising:

identifying a plurality of used rows and a plurality of unused rows of nonvolatile data cells within a common bulk region of the memory, at least some of the unused rows being either bad rows or redundant rows;

preprogramming the data cells of the used rows;

during the preprogramming step, establishing on the data cells of the unused rows a bias condition that tends to converge the data cells of the unused rows to a threshold voltage near a UV erased threshold; and erasing the data cells of the used rows.

2. The method of claim 1 further comprising:

verifying that the used cells have an acceptable programmed threshold after the preprogramming step;

verifying that the used cells have an acceptable first erased threshold after the erasing step;

verifying that the used cells have an acceptable second erased threshold after the erasing step;

post-programming the data cells of the used rows that fail the second erase threshold verifying step; and during the post-programming step, establishing on the data cells of the unused rows a bias condition that tends to converge the data cells of the unused rows to a threshold voltage near a UV erased threshold.

3. The method of claim 1 wherein the identifying step comprises:

predecoding an address to select a sector of the memory containing the used rows and the unused rows of nonvolatile data cells.

4. The method of claim 1 wherein:

the preprogramming step comprises:

establishing a source/drain bias condition in selected columns of the data cells to generate hot electrons; and applying a large positive voltage to a selected one of the used rows to establish an increased threshold voltage in the data cells of the selected used row and the selected columns; and the establishing step comprises:

applying essentially a ground potential to the used rows other than the selected used row;

wherein the data cells of the unselected unused rows and the selected columns tends to converge to a threshold voltage near the UV erased threshold.

5. The method of claim 4 wherein:
the source/drain bias condition is a source potential of about ground and a drain potential of about 5 volts; and
the large positive voltage is about 10 volts.

6. The method of claim 4 further comprising:
verifying that the used cells have an acceptable programmed threshold after the preprogramming step;
verifying that the used cells have an acceptable first erased threshold after the erasing step;
verifying that the used cells have an acceptable second erased threshold after the erasing step;
post-programming the data cells of the used rows that fail the second erase threshold verifying step by:
establishing a source/drain bias condition in selected columns of the data cells to generate hot electrons; and
applying a positive voltage to a selected one of the used rows to establish an increased threshold voltage in the data cells of the selected used row and the selected columns; and
during the post-programming step, establishing on the data cells of the unused rows a bias condition that tends to converge the data cells of the unused rows to a threshold voltage near a UV erased threshold by applying essentially a ground potential to the used rows other than the selected used row.

7. The method of claim 6 wherein:
the source/drain bias condition during the programming step is a source potential of about ground and a drain potential of about 5 volts;
the large positive voltage during the programming step is about 10 volts;
the source/drain bias condition during the post-programming step is a source potential of about ground and a drain potential of about 3 volts; and
the positive voltage during the post-programming step is about 5 volts.

8. A method of performing an embedded erase of non-volatile semiconductor memory having a plurality of rows of data cells arranged in a plurality of sectors, wherein some of the rows of data cells within each sector are regular rows of data cells and some of the rows of data cells within each sector are redundant rows of data cells, the method comprising:
identifying a plurality of word line groups for use, within each of the sectors;
identifying at least one word line group within each of the sectors for nonuse; selecting a sector;
programming the data cells in the word line groups identified for use in the selected sector;
biasing the rows of the word line group or groups identified for nonuse during the programming step so that the data cells thereof tend to converge to a threshold voltage near a UV erased threshold;
erasing the data cells in the word line groups identified for use in the selected sector; and
biasing the rows of the word line group or groups identified for nonuse during the erasing step so that the data cells thereof are not erased.

9. The method of claim 8 wherein the programming step comprises:
preprogramming the data cells of the word line groups identified for use in the selected sector; and
verifying the preprogramming step.

10. The method of claim 9 further comprising:
verifying the erasing step;
wherein the programming step further comprises;
verifying post-programming of the data cells of the word line groups in the selected sector identified for use in the selected sector; and
post-programming the data cells of the word line groups in the selected sector identified for use in the selected sector.

11. A nonvolatile semiconductor memory comprising:
a memory array having a plurality of rows of nonvolatile data cells arranged in a plurality of sectors, the rows of data cells having respective word lines;
a plurality of word line drivers coupled to the word lines;
a plurality of word line pre-drivers coupled to respective groups of the word line drivers;
a sector pre-decoder coupled to the word line pre-drivers;
a regular word line group pre-decoder coupled to the word line pre-drivers;
a redundant word line group pre-decoder coupled to the word line drivers;
a word line pre-decoder coupled to the word line pre-drivers;
a redundant word line group selector coupled to the redundant word line group pre-decoder; and
an X address line coupled to the sector pre-decoder, the regular word line group pre-decoder, the redundant word line group pre-decoder, the word line pre-decoder, and the redundant word line group selector.

12. The nonvolatile semiconductor memory of claim 11:
wherein the redundant word line group selector identifies one or more unused regular word line groups and one or more used redundant word line groups;
further comprising a memory controller comprising:
a component for applying a plurality of preprogramming voltages to the word line pre-drivers and to the word line drivers during an embedded sector erase to establish a program bias condition in used word line groups of a selected sector and to establish a bit line convergence bias condition in unused word line groups of the selected sector that tends to converge the data cells thereof to a threshold voltage near a UV erased threshold;
the used word line groups being any of the used redundant word line groups in the selected sector line and the regular word line groups in the selected sector except for any of the unused regular word line groups in the selected sector; and
the unused word line groups being any of the unused regular word line groups in the selected sector line and the redundant word line groups in the selected sector except for any of the unused redundant word line groups in the selected sector; and
a component for applying a plurality of erase voltages to the word line pre-drivers and to the word line drivers during an embedded sector erase to establish an erase bias condition in used word line groups of a selected sector and to establish a bias condition in unused word line groups of the selected sector to avoid erasure thereof.

13. The nonvolatile semiconductor memory of claim 12 wherein:
each of the word line pre-drivers is coupled to sixteen of the word line drivers; and
each of the sectors comprises thirty-two regular word line groups and two redundant word line groups.

14. A nonvolatile semiconductor memory comprising:
means for identifyng a plurality of used rows and a plurality of unused rows of nonvolatile data cells within a common bulk region of the memory, at least some of the unused rows being either bad rows or redundant rows;

means for preprogramming the data cells of the used rows;

means for establishing on the data cells of the unused rows, in coordination with the preprogramming means, a bias condition that tends to converge the data cells of the unused rows to a threshold voltage near a UV erased threshold; and means for erasing the data cells of the used rows.

15. The nonvolatile semiconductor memory of claim 14 further comprising:

means for verifying that the used cells have an acceptable programmed threshold after being preprogramming;

means for verifying that the used cells have an acceptable first erased threshold after being erased;

means for verifying that the used cells have an acceptable second erased threshold after being erased;

means for post-programming the data cells of the used rows that fail the second erase threshold verification; and establishing on the data cells of the unused rows, during the post-programming step, a bias condition that tends to converge the data cells of the unused rows to a threshold voltage near a UV erased threshold.

* * * * *